United States Patent
Liu et al.

(10) Patent No.: US 9,443,815 B2
(45) Date of Patent: Sep. 13, 2016

(54) EMBEDDED DIE REDISTRIBUTION LAYERS FOR ACTIVE DEVICE

(71) Applicant: Maxim Integrated Products, Inc., San Jose, CA (US)

(72) Inventors: Kai Liu, Mountain View, CA (US); Kumar Nagarajan, Cupertino, CA (US); Satbir Madra, Santa Clara, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/317,878

(22) Filed: Jun. 27, 2014

(65) Prior Publication Data

US 2015/0243590 A1     Aug. 27, 2015

Related U.S. Application Data

(60) Provisional application No. 61/942,845, filed on Feb. 21, 2014.

(51) Int. Cl.
| | |
|---|---|
| *H01L 23/02* | (2006.01) |
| *H01L 23/00* | (2006.01) |
| *H01L 23/36* | (2006.01) |
| *H01L 23/492* | (2006.01) |

(52) U.S. Cl.
CPC .............. *H01L 24/26* (2013.01); *H01L 23/36* (2013.01); *H01L 23/492* (2013.01); *H01L 24/19* (2013.01); *H01L 24/24* (2013.01); *H01L 24/82* (2013.01); *H01L 24/29* (2013.01); *H01L 24/32* (2013.01); *H01L 24/73* (2013.01); *H01L 24/92* (2013.01); *H01L 2224/04105* (2013.01); *H01L 2224/12105* (2013.01); *H01L 2224/24226* (2013.01); *H01L 2224/24246* (2013.01); *H01L 2224/2919* (2013.01); *H01L 2224/32225* (2013.01); *H01L 2224/32245* (2013.01); *H01L 2224/73267* (2013.01); *H01L 2224/92244* (2013.01); *H01L 2924/12042* (2013.01)

(58) Field of Classification Search
USPC .......... 257/E21.499, E21.575, 713, E21.538, 257/678, 706, 720, 723, 774; 438/106, 622, 438/127, 15, 25, 26
See application file for complete search history.

(56) References Cited

U.S. PATENT DOCUMENTS

| | | | | |
|---|---|---|---|---|
| 8,187,920 B2* | 5/2012 | Mohan et al. | ............... | 438/106 |
| 8,294,276 B1* | 10/2012 | Kim et al. | .................... | 257/775 |
| 8,482,118 B2* | 7/2013 | Mohan et al. | ............... | 257/698 |
| 8,535,978 B2* | 9/2013 | Scanlan | ........................ | 438/107 |
| 8,536,695 B2* | 9/2013 | Liu et al. | ....................... | 257/700 |
| 8,604,600 B2* | 12/2013 | Scanlan | ........................ | 257/690 |
| 8,922,021 B2* | 12/2014 | Scanlan | ........................ | 257/773 |
| 2009/0212424 A1* | 8/2009 | Chen | ............................. | 257/737 |
| 2011/0163457 A1* | 7/2011 | Mohan et al. | ................. | 257/774 |
| 2012/0217625 A1* | 8/2012 | Mohan et al. | ................. | 257/664 |

(Continued)

*Primary Examiner* — Telly Green
(74) *Attorney, Agent, or Firm* — Advent, LLP

(57) ABSTRACT

Embedded die packages are described that employ one or more substrate redistribution layers (RDL) to route electrode nodes and/or for current redistribution. In one or more implementations, an integrated circuit die is embedded in a copper core substrate. A substrate RDL contacts a surface of the embedded die, with at least one via (e.g., thermal via) in contact with the surface RDL to furnish electrical interconnection between the embedded die and an external contact. Additional substrate RDL or WLP RDL can be incorporated into the package to provide varying current distribution between the embedded die and external contacts.

11 Claims, 3 Drawing Sheets

(56) References Cited

U.S. PATENT DOCUMENTS

| | | | |
|---|---|---|---|
| 2012/0228754 A1* | 9/2012 | Liu et al. ...................... 257/676 |
| 2014/0264930 A1* | 9/2014 | Yu .......................... H01L 21/50 257/774 |
| 2015/0091171 A1* | 4/2015 | Wachter ................ H01L 21/561 257/741 |
| 2015/0115456 A1* | 4/2015 | Scanlan ........................ 257/773 |
| 2015/0221714 A1* | 8/2015 | Gu .......................... H01L 24/02 257/532 |

* cited by examiner

EMBEDDED DIE REDISTRIBUTION LAYERS FOR ACTIVE DEVICE

CROSS-REFERENCE TO RELATED APPLICATIONS

The present application claims the benefit under 35 U.S.C. §119(e) of U.S. Provisional Application Ser. No. 61/942,845, entitled EMBEDDED DIE REDISTRIBUTION LAYERS FOR ACTIVE DEVICE, filed Feb. 21, 2014. U.S. Provisional Application Ser. No. 61/942,845 is hereby incorporated by reference in its entirety.

BACKGROUND

Consumer electronic devices, in particular, mobile electronic devices such as smart phones, tablet computers, and so forth, increasingly employ smaller, more compact components to furnish their users with desired features. Such devices often employ three dimensional integrated circuit devices (3D IC). Three-dimensional integrated circuit devices are semiconductor devices that employ two or more layers of active electronic components. Through-substrate vias (TSV) interconnect electronic components on the different layers (e.g., different substrates) of the device allowing the devices to be integrated vertically as well as horizontally. Consequently, three-dimensional integrated circuit devices can provide increased functionality within a smaller, more compact footprint than do conventional two-dimensional integrated circuit devices.

Traditional fabrication processes used in the manufacture of semiconductor devices employ microlithography to pattern integrated circuits onto a circular wafer formed of a semiconductor such as silicon, gallium arsenide, and so forth. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board or other substrate.

SUMMARY

Embedded die packages are described that employ one or more substrate redistribution layers (RDL) to route electrode nodes and/or for current redistribution. In one or more implementations, an integrated circuit die is embedded in substrate. A substrate RDL is at least one of in contact with or indirectly coupled to a surface of the embedded integrated circuit die, with at least one via (e.g., thermal via) in contact with the surface RDL to furnish electrical interconnections. Additional substrate RDL or WLP RDL can be incorporated into the package to provide varying current distribution between the embedded die and external contacts.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Packaging technologies, such as those incorporating lead frame packaging, are utilized to integrate circuit devices with a package to facilitate introduction of the integrated circuit with external electrical contacts (e.g., electrical contacts of a printed circuit board (PCB)). For example, wafer level packaging (WLP) can be utilized with wafer bumping to provide an IC device, whereby flipping the orientation of the IC device is flipped onto a lead-frame or a substrate to generate a package. During package assembly, solder connections (e.g., solder balls or bumps) can be used to match electrical connectors of the IC device and the lead-frame or substrate. However, such configurations can cause electromigration-related failures due to the use of a solder alloy as an interconnect, can pose flexibility and routable design capability problems, can pose board level reliability problems, and can require a relatively thick form factor, thereby increasing the overall size of the product package.

Accordingly, embedded integrated circuit devices are described that employ one or more substrate redistribution layers to route electrode nodes and/or for current redistribution. In one or more implementations, no solder is utilized in the package assembly and construction of the embedded integrated circuit devices, resulting in a relatively thin package (e.g., small form factor) having high efficiency and a flexible package design. In one or more implementations, an integrated circuit die is embedded in a copper core substrate. A substrate redistribution layer (RDL) contacts a surface of the embedded die, with at least one via (e.g., thermal via) in contact with the surface RDL to furnish electrical interconnection between the embedded die and an external contact. At least a portion of the surface of the die can include a passivation layer to provide electrical insulation and/or protection to a portion of the die. Additional substrate RDL or WLP RDL can be incorporated into the package to provide varying current distribution between the embedded die and external contacts.

Example Implementations

Figure 1:
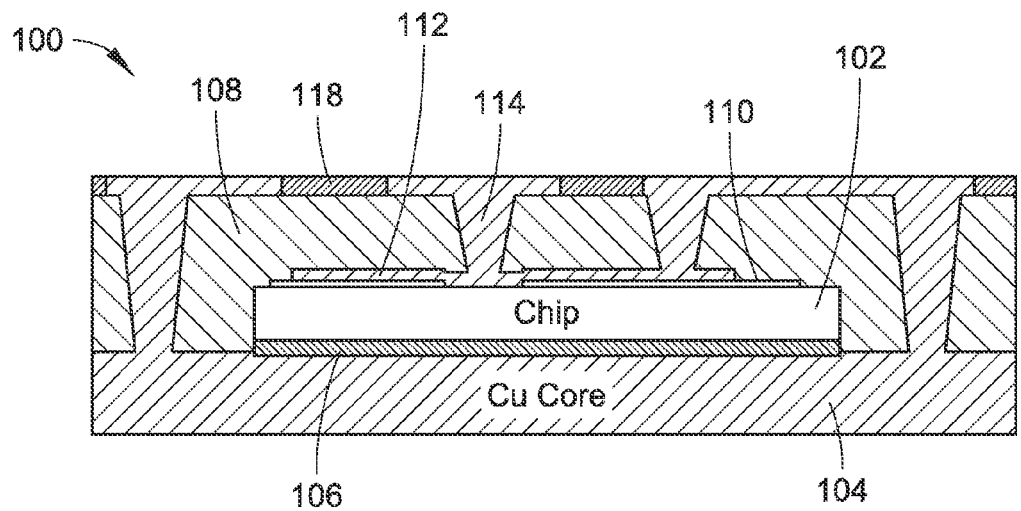
FIG. 1 is a diagrammatic cross-sectional view illustrating an embedded integrated circuit package having a substrate redistribution layer in accordance with an example implementation of the present disclosure.

FIG. 1 illustrates an embedded integrated circuit package 100 in accordance with example implementations of the present disclosure. As shown, the embedded integrated circuit package 100 includes an active integrated circuit chip (or die) 102 embedded in a substrate 104. In one or more implementations, the substrate 104 comprises a copper core substrate, although alternative or additional materials may be utilized, including, but not limited to, silicon or other printed circuit board (PCB) material, and so forth. For example, the substrate 104 may be fabricated from a copper core sheet material. In one more implementations, the embedded integrated circuit package 100 is integrated as a field effect transistor (FET), such as a laterally diffused high power field-effect transistor (LSMOS-FET).

The embedded die 102 can be affixed to the substrate 104 via an adhesive material 106. In an implementation, the adhesive material 106 used to affix the embedded die 102 to the substrate 104 is a die attach film (DAF). The DAF may be affixed to the die 102 prior to singulation of the die 102 from its wafer during processing, whereby the DAF and die 102 are subsequently affixed to the substrate 104 as a unit. The package 100 may include a laminate material 108 (e.g., dielectric material, glass-based material, transparent material, epoxy, and so forth) distributed over the die 102 on the substrate 104. Since the die 102 is embedded within the substrate 104, the package 100 may be free from molding (e.g., may not require the structural support of molding to fix the position of a die with respect to a substrate) and/or from solder ball connections (since the substrate RDL(s) provide the necessary electrical connectivity between the embedded die and a surface of the substrate/package), which may provide a relatively thin package 100. For example, the package 100 may have a thickness of from about 0.4 mm (millimeters) to about 0.5 mm (millimeters), whereas conventional packages may be about 0.7 mm (millimeters) and greater.

A passivation layer 110 can be formed on at least one side of the die 102 within the package 100. The passivation layer 110 may include an electrical insulator that functions as an insulator and/or a protective layer for the die 102 and/or other components of the package 100 from later fabrication steps and environmental factors. In one implementation, the passivation layer 110 can include a layer of silicon dioxide ($SiO_2$) formed on a top surface of the die 102 while not covering contact pads of the die 102. In another implementation and depending on the fabrication process, the passivation layer 110 may include a soldermask. In other implementations, the passivation layer 110 may also include a thin film (e.g., benzocyclobutene (BCB), etc.).

The package 100 also includes one or more substrate redistribution layers (RDL) 112 formed within the package 100. In general, a substrate RDL can be a thicker material than a conventional wafer level package (WLP) RDL and can therefore provide a package with improved current handling capabilities as compared to a package which solely utilizes WLP RDL(s). For example, in one or more implementations, a 20 micron thick substrate RDL can be used. As shown in FIG. 1, the package 100 includes one substrate RDL 112 to furnish electrical interconnection between the embedded die 102 and an external contact. In one or more implementations, the substrate RDL 112 is formed by drilling (e.g., laser drilling) into the laminate material 108 and depositing plated copper within the package 100 on at least a portion of the surface of the die 102 (and may also contact a portion of the passivation layer 110). The package includes one or more vias (e.g., thermal vias) 114 in contact with the substrate RDL 112. For example, the vias 114 may be formed beginning from a surface 116 of the package 100 and continuing onto a portion of the die 102. The surface of the package 100 may include a soldermask material 118 positioned between the vias 114 to define the pattern of the exposed substrate (e.g., exposed copper on the surface of the package 100). While FIG. 1 displays a package 100 with one substrate RDL, it is contemplated that other/additional configurations of RDL may be utilized within a package 100, as described below. Further, while the packages described herein show a single embedded die, in one or more implementations, the packages can also include multiple (e.g., two or more) embedded dies embedded within a substrate. Where the package includes multiple embedded dies, the dies can be electrically connected to one or more other dies within the package. By utilizing multiple dies, one or more of the dies can differ from respective other dies in function, size, configuration, and so forth.

Figure 2:
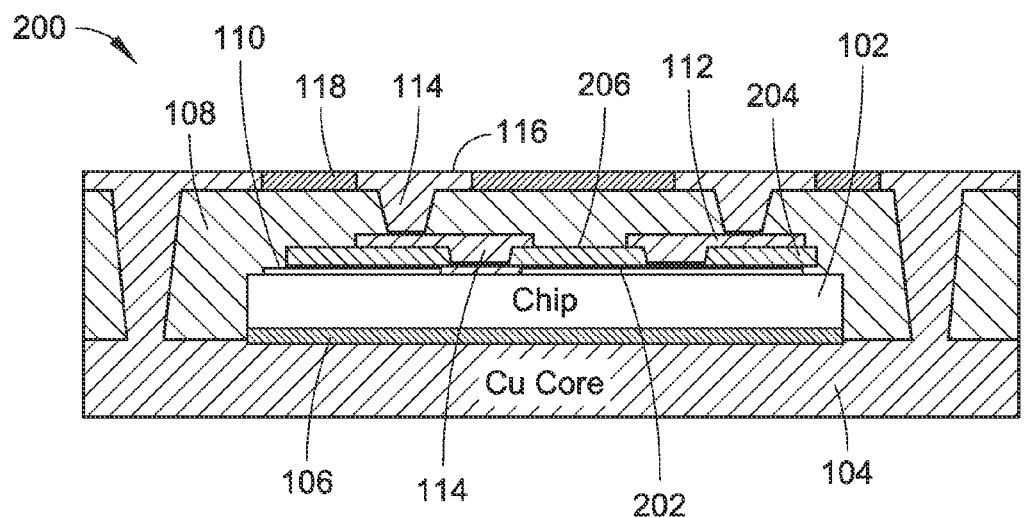
FIG. 2 is a diagrammatic cross-sectional view illustrating an embedded integrated circuit package having a substrate redistribution layer and a wafer level package redistribution layer in accordance with an example implementation of the present disclosure.

Referring now to FIG. 2, an embedded integrated circuit package 200 having two layers of redistribution layers is shown in accordance with example implementations of the present disclosure. As shown, the package 200 incorporates a substrate RDL 112 and a wafer level package (WLP) RDL 202, which can incorporate node flexibility for differing pitch designs. Similar to the package 100 of FIG. 1, the package 200 may include one or more of the embedded die 102, the substrate 104, the adhesive material 106, the laminate material 108, the passivation layer 110, vias 114, and the soldermask 118. The package 200 may also include a repassivation layer 204 positioned between the surface 116 of the package 200 and the WLP RDL 202. For example, the repassivation layer 204 can be positioned between the substrate RDL 112 and the WLP RDL 202, such that the substrate RDL 112 is formed on the repassivation layer 204. One or more vias 114 may connect the WLP RDL 202 with a surface RDL 112 formed on a top surface 206 of the repassivation layer 204. The package 200 may include one or more vias 114 in contact with the substrate RDL 112. For example, the vias 114 may be formed beginning from a surface 116 of the package 200 and continuing onto the substrate RDL 112 positioned on the top surface 206 of the repassivation layer 204. The surface 116 of the package 200 may include a soldermask material 118 positioned between the vias 114. In one or more implementations, additional substrate layers may be added to address power requirements or current distribution for particular device designs.

Figure 3:
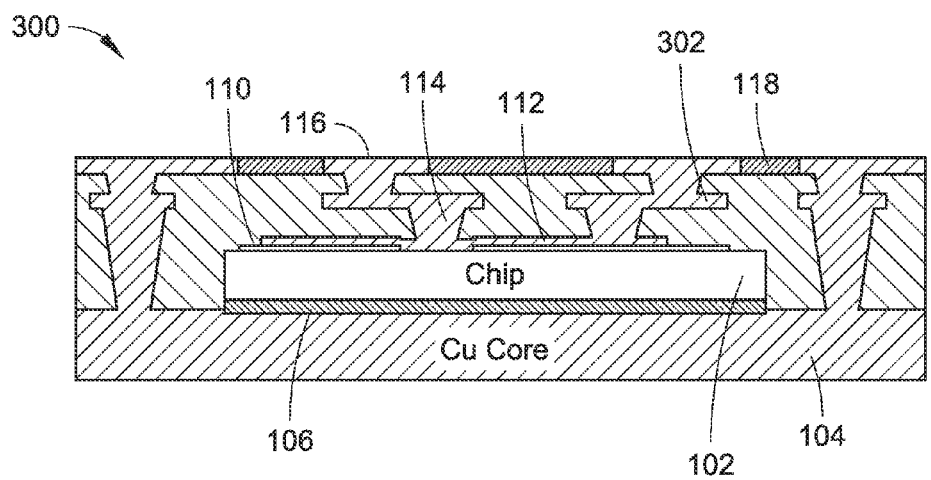
FIG. 3 is a diagrammatic cross-sectional view illustrating an embedded integrated circuit package having multiple layers of substrate redistribution layers in accordance with an example implementation of the present disclosure.

Referring now to FIG. 3, an embedded integrated circuit package 300 having two layers of redistribution layers is shown in accordance with example implementations of the present disclosure. As shown, the package 300 incorporates a first substrate RDL 112 and a second substrate RDL 302. Similar to the package 100 of FIG. 1 and/or the package 200 of FIG. 2, the package 300 may include one or more of the embedded die 102, the substrate 104, the adhesive material 106, the laminate material 108, the passivation layer 110, vias 114, and the soldermask 118. The first substrate RDL 112 of the package 300 may be positioned on at least a portion of the surface of the die 102 (and may also contact a portion of the passivation layer 110). The second substrate RDL 302 may be positioned between the first substrate RDL 112 and the surface 116 of the package 300. One or more vias 114 may connect the first substrate RDL 112 with the second substrate RDL 302. Additionally, the package 300 may include one or more vias 114 in contact with the second substrate RDL 302. For example, the vias 114 may be formed beginning from the surface 116 of the package 300 and continuing onto the second substrate RDL 302 positioned between the surface 116 of the package 300 and the first substrate RDL 112. The surface 116 of the package 300 may include a soldermask material 118 positioned between the vias 114. In one or more implementations, additional substrate layers may be added to address power requirements or current distribution for particular device designs.

Figure 4:
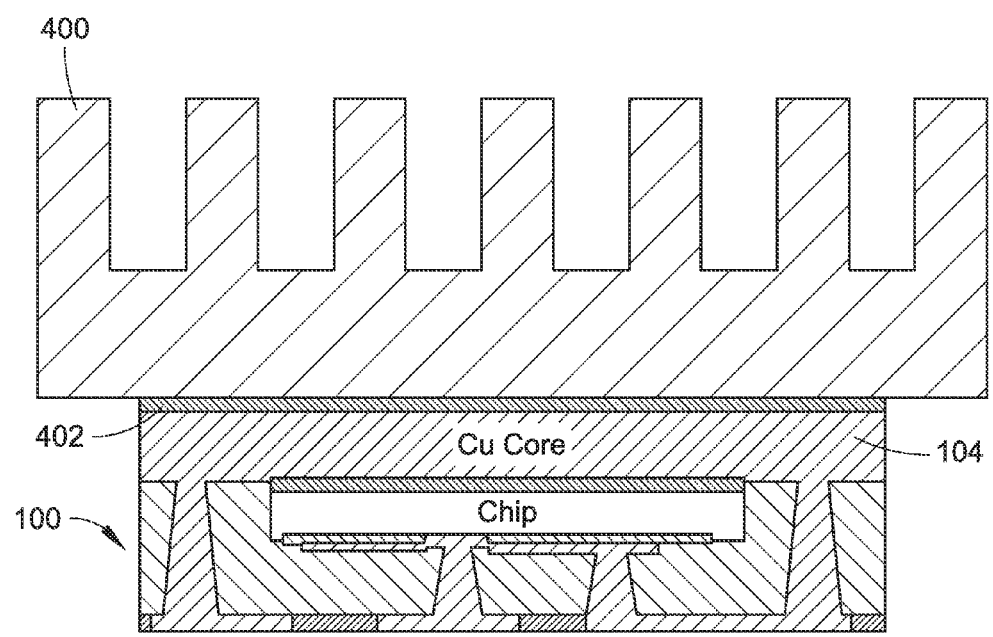
FIG. 4 is a diagrammatic cross-sectional view illustrating an the embedded integrated circuit package of FIG. 1 coupled to an external heat sink in accordance with an example implementation of the present disclosure.

Referring now to FIG. 4, the embedded integrated circuit package 100 is shown coupled with a heat sink assembly 400. As shown, the package 100 is attached to the heat sink assembly 400 via a thermally conductive material 402 positioned between the heat sink assembly 400 and the substrate 104 of the package 100. The heat sink assembly 400 is configured to dissipate heat generated by the package 100 and transferred to the heat sink assembly 400 via the thermally conductive material 402. The design of the heat sink assembly 400 can depend on the characteristics of the package 100. For example, the heat sink assembly 400 can be a pin-fin type heat sink (such as shown in FIG. 4). In implementations, the substrate 104 of the package 100 is a metallic substrate (e.g., copper core substrate), where a direct connection can be made between the substrate 104 and the heat sink assembly 400. Such a direct connection can provide enhanced thermal performance of the package 400 due to efficient heat transfer mechanics between the package 400 and the heat sink assembly 400. In embodiments, the thermally conductive material 402 can be a thermally conductive adhesive, such as a thermally enhanced adhesive material (TEAM).

Figure 5:
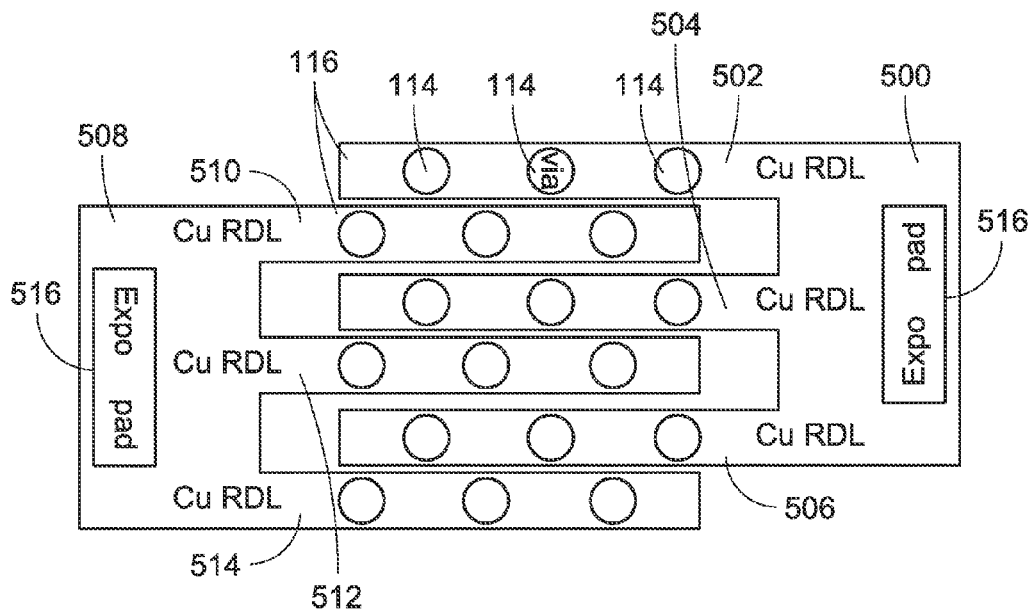
FIG. 5 is a diagrammatic top plan view of a layout configuration of embedded integrated circuit packages in accordance with an example implementation of the present disclosure.
Figure 6:
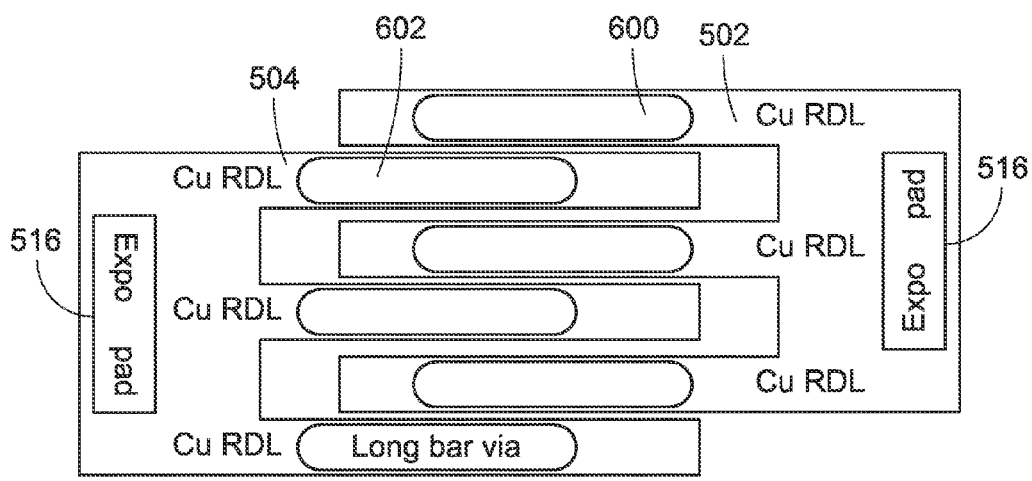
FIG. 6 is a diagrammatic top plan view of the layout configuration of FIG. 5, with long bar vias distributed over the surface of the package in accordance with an example implementation of the present disclosure.

Referring generally to FIGS. 5 and 6, embedded circuit packages may be positioned relative to each other to form layout configurations, shown from a top view perspective. For example, a plurality of vias 114 may extend from a surface 116 of one or more packages to one or more embedded integrated circuits (e.g., as shown in FIGS. 1-4). The layout configurations can be applicable to each of the package structures shown in FIGS. 1-4. In the layout configurations shown in FIGS. 5 and 6, a first copper RDL 500 forms three extension portions 502, 504, 506, each of which includes a plurality of vias 114 that can be directly or indirectly connected to an embedded die. A second copper RDL 508 forms three extension portions 510, 512, and 514, each of which includes a plurality of vias 114 that can be directly or indirectly connected to an embedded die. The extension portions for each of the first copper RDL 500 and the second copper RDL 508 can have the same or differing physical characteristics, including, but not limited to, length, thickness, and so forth. In implementations, the extension portions of the first copper RDL 500 are arranged in an interleaved or staggered manner with respect to the extension portions of the second copper RDL 508. For instance, extension portion 502 of the first copper RDL 500 is positioned adjacent extension portion 510 of the second copper RDL 508. The extension portion 510 of the second copper RDL 508 is also positioned adjacent extension portion 504 of the first copper RDL 500. The extension portion 504 is also positioned adjacent extension portion 512 of the second copper RDL 512. The extension portions continue in an interleaved manner. Other configurations of extension portions may be provided, such that the differing configuration may provide differing performance characteristics of the associated packages. For example, one or more extension portions of the first copper RDL 500 may be adjacent one another before an extension portion of the second copper RDL 508 intercedes.

One or more exposed pads 516 may be present with respect to each of the first copper RDL 500 and the second copper RDL 508. Other portions of the copper RDLs may be covered, such as by a soldermask. Each extension portion may be connected to an exposed pad 516, such that each extension portion is connected via the exposed pad 516, providing great flexibility to the design. The exposed pads 516 are generally accessible on an external portion of the package that integrates the RDLs. As shown in FIG. 6, a long bar via may connect two or more vias 114 on an extension portion, such as to improve the electrical performance of the vias. For example, the long bar via 600 connects each via of extension portion 502, whereas long bar via 602 connects each via of extension portion 510. Moreover, the packages described herein may provide generally flexible design capabilities, such as by supporting ball grid array (BGA) and land grid array (LGA) package types.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. An embedded integrated circuit package comprising:
   a substrate assembly;
   an integrated circuit die embedded within the substrate assembly;
   a laminate material in contact with the integrated circuit die;
   a passivation layer having at least a portion in direct contact with a surface of the embedded integrated circuit die;
   at least one substrate redistribution layer having at least a portion in direct contact with the surface of the embedded integrated circuit die and at least another portion in direct contact with the passivation layer, the at least one substrate redistribution layer further including at least a portion positioned between the laminate material and the passivation layer where at least a portion of the passivation layer is positioned between the surface of the embedded integrated circuit die and the at least another portion of the at least one substrate redistribution layer, the surface of the embedded integrated circuit die in direct contact with each of the laminate material, the passivation layer, and the at least one substrate redistribution layer; and
   a via in contact with the substrate redistribution layer.

2. The embedded integrated circuit package as recited in claim 1, wherein the substrate assembly includes a copper substrate.

3. The embedded integrated circuit package as recited in claim 1, wherein the embedded integrated circuit package is free from solder ball interconnects.

4. The embedded integrated circuit package as recited in claim 1, further comprising:
   a wafer-level package redistribution layer coupled to the surface of the embedded integrated circuit die,
   wherein the at least one substrate redistribution layer is indirectly coupled to the surface of the embedded integrated circuit die by at least one via.

5. The embedded integrated circuit package as recited in claim 4, wherein the wafer-level package redistribution layer is thinner than the at least one substrate redistribution layer.

6. The embedded integrated circuit package as recited in claim 1, wherein the at least one substrate redistribution layer includes a first substrate redistribution layer in contact with the surface of the embedded integrated circuit die and includes a second substrate redistribution layer operably coupled to the first substrate redistribution layer by at least one via.

7. The embedded integrated circuit package as recited in claim 1, further comprising:
a heat sink assembly coupled to the substrate assembly.

8. An embedded integrated circuit package comprising:
a first redistribution layer forming a plurality of extension portions, each of the plurality of extension portions including one or more embedded circuit packages having one or more vias operably coupled with an embedded die, wherein at least one of the one or more embedded circuit packages includes
a substrate assembly;
an integrated circuit die embedded within the substrate assembly;
a laminate material in contact with the integrated circuit die;
a passivation layer having at least a portion in direct contact with a surface of the embedded integrated circuit die;
at least one substrate redistribution layer having at least a portion in direct contact with the surface of the embedded integrated circuit die and at least another portion in direct contact with the passivation layer, the at least one substrate redistribution layer further including at least a portion positioned between the laminate material and the passivation layer where at least a portion of the passivation layer is positioned between the surface of the embedded integrated circuit die and the at least another portion of the at least one substrate redistribution layer, the surface of the embedded integrated circuit die in direct contact with each of the laminate material, the passivation layer, and the at least one substrate redistribution layer; and
a via in contact with the substrate redistribution layer; and
a second redistribution layer forming a second plurality of extension portions, each of the second plurality of extension portions including one or more embedded circuit packages having one or more vias operably coupled with an embedded die,
wherein one or more of the plurality of extension portions of the first redistribution layer are positioned adjacent to one or more of respective portions of the second plurality of extension portions, and wherein portions of the plurality of extension portions are arranged in an interleaved configuration with respect to respective portions of the second plurality of extension portions.

9. The embedded integrated circuit package as recited in claim 8, further comprising:
one or more long bar vias positioned on a surface of one or more of the first redistribution layer and the second redistribution layer, each of the one or more long bar vias connecting at least two of the one or more vias.

10. The embedded integrated circuit package as recited in claim 8, wherein one or more of the first redistribution layer and the second redistribution layer includes an exposed pad portion, the exposed pad portion being exposed external the package.

11. The embedded integrated circuit package as recited in claim 1, wherein at least a portion of the passivation layer is in direct contact with each of the laminate material, the embedded integrated circuit die, and the at least one substrate redistribution layer.

* * * * *